(12) United States Patent
Yoshizawa

(10) Patent No.: US 7,355,341 B2
(45) Date of Patent: Apr. 8, 2008

(54) ORGANIC ELECTROLUMINESCENCE DISPLAY PANEL INCLUDING A GAS BARRIER LAMINATE BETWEEN A SUBSTRATE AND AN ORGANIC ELECTROLUMINESCENCE ELEMENT

(75) Inventor: Tatsuya Yoshizawa, Tsurugashima (JP)

(73) Assignee: Pioneer Corporation, Tokyo (JP)

( * ) Notice: Subject to any disclaimer, the term of this patent is extended or adjusted under 35 U.S.C. 154(b) by 334 days.

(21) Appl. No.: 10/963,780

(22) Filed: Oct. 14, 2004

(65) Prior Publication Data
US 2005/0116637 A1    Jun. 2, 2005

(30) Foreign Application Priority Data
Oct. 16, 2003   (JP)   ............... 2003-356107

(51) Int. Cl.
  *H01J 1/62*   (2006.01)
  *H01J 63/04*  (2006.01)
(52) U.S. Cl. ................. 313/506; 313/512; 313/504
(58) Field of Classification Search ................ 313/504, 313/506, 512
   See application file for complete search history.

(56) References Cited

U.S. PATENT DOCUMENTS

| | | | | |
|---|---|---|---|---|
| 5,686,360 A | * | 11/1997 | Harvey et al. | ............... 438/28 |
| 5,757,126 A | * | 5/1998 | Harvey et al. | ............. 313/506 |
| 5,811,177 A | * | 9/1998 | Shi et al. | .................... 428/209 |
| 6,268,695 B1 | * | 7/2001 | Affinito | ...................... 313/504 |
| 6,522,067 B1 | * | 2/2003 | Graff et al. | ................. 313/512 |
| 6,537,688 B2 | * | 3/2003 | Silvernail et al. | ........... 428/690 |
| 6,570,325 B2 | * | 5/2003 | Graff et al. | ................. 313/506 |
| 6,576,351 B2 | * | 6/2003 | Silvernail | ................... 428/690 |
| 6,597,111 B2 | * | 7/2003 | Silvernail et al. | ........... 313/506 |
| 6,614,057 B2 | * | 9/2003 | Silvernail et al. | ............. 257/99 |
| 6,664,137 B2 | * | 12/2003 | Weaver | ...................... 438/125 |
| 6,866,901 B2 | * | 3/2005 | Burrows et al. | ............. 428/1.5 |
| 6,962,671 B2 | * | 11/2005 | Martin et al. | ................. 264/81 |
| 6,965,195 B2 | * | 11/2005 | Yamazaki et al. | .......... 313/498 |
| 7,164,155 B2 | * | 1/2007 | Yamazaki et al. | ............. 257/84 |
| 2002/0068143 A1 | * | 6/2002 | Silvernail et al. | ............. 428/76 |
| 2003/0117066 A1 | * | 6/2003 | Silvernail | ................... 313/504 |
| 2004/0004214 A1 | * | 1/2004 | Yamazaki et al. | ............. 257/40 |
| 2004/0247949 A1 | * | 12/2004 | Akedo et al. | ............... 428/704 |
| 2005/0017633 A1 | * | 1/2005 | Miyadera | ................... 313/512 |

\* cited by examiner

*Primary Examiner*—Peter Macchiarolo
(74) *Attorney, Agent, or Firm*—McGinn IP Law Group, PLLC

(57) ABSTRACT

An organic electroluminescence display panel includes an organic electroluminescence element and a resin substrate that supports the organic electroluminescence element. A gas barrier laminate is formed between the resin substrate and the organic electroluminescence element. The gas barrier laminate includes two or more inorganic barrier layers and one or more polymer compound layers each provided between the inorganic barrier layers. The exposed parts of the polymer compound layer that are not covered by the inorganic barrier layers are subjected to plasma processing. The exposed parts may be covered by a cover layer or a sealing layer that affords gas barrier properties.

14 Claims, 5 Drawing Sheets

ORGANIC ELECTROLUMINESCENCE DISPLAY PANEL INCLUDING A GAS BARRIER LAMINATE BETWEEN A SUBSTRATE AND AN ORGANIC ELECTROLUMINESCENCE ELEMENT

BACKGROUND OF THE INVENTION

1. Field of the Invention

The present invention relates to an organic electroluminescence display panel and to a fabrication method thereof.

2. Description of the Related Art

An organic electroluminescence display panel (hereinafter called an 'organic EL display panel') includes an organic electroluminescence element (hereinafter called an 'organic EL element'). In the organic EL element, an organic functional layer made from an organic compound material that affords electroluminescence is interposed between an anode and a cathode. The organic functional layer is a laminate body which can have a variety of configuration. For example, a certain organic functional layer has a three-layer structure, which includes a light emission layer made from an organic compound material affording electroluminescence, a light emission layer and an organic electron transport layer. Another organic functional layer has another three-layer structure which includes an organic positive hole transport layer, a light emission layer and an organic electron transport layer. Still another organic functional layer has a two-layer structure consisting of an organic positive-hole transport layer and a light emission layer. In addition, an electron or positive-hole injection layer and transport block layer may also be inserted between suitable layers among the aforementioned layers.

The organic EL element is supported on a substrate. The substrate is a glass substrates or a resin substrate. One typical resin substrate is a plastic film substrate. The plastic film substrate is flexible so that it is possible to manufacture a flexible display panel.

When exposed to the atmosphere, an organic EL element deteriorates as a result of being affected by moisture, gases such as oxygen and certain types of molecules in the environments. In particular, characteristic deterioration is prominent in organic EL display panels that use a plastic film substrate, i.e., light emission characteristics such as the brightness and hue deteriorate.

In order to prevent such characteristic deterioration, an inorganic barrier film is deposited to a resin substrate. The inorganic barrier film prevents the transmission of moisture and gases such as oxygen. This is gas barrier properties. However, pinholes occur in this inorganic barrier film. These pinholes are sometimes generated as a result of unevenness in the surface of the material where the inorganic barrier film is deposited or the adhesion of foreign matter prior to film deposition. The pinholes may also occur during film deposition. Thus, it is difficult to rid the inorganic barrier film of such pinholes completely. Moisture and gases are able to reach the organic EL element via the pinholes. Consequently, even when an inorganic barrier film is provided on the resin substrate, it is impossible to completely prevent deterioration of the organic EL element.

SUMMARY OF THE INVENTION

According to a first aspect of the present invention, there is provided an improved organic EL display panel having an organic EL element. The organic EL element has first and second display electrodes. One or more organic functional layers made from an organic compound are interposed between the first and second display electrodes. The organic EL display panel also has a resin substrate that supports the organic EL element. The organic EL display panel also has a gas barrier laminate between the resin substrate and the organic EL element. The gas barrier laminate has two or more inorganic barrier layers and one or more polymer compound layers that are each provided between the inorganic barrier layers. Exposed parts of the polymer compound layers that are not covered by the inorganic barrier layers are subjected to plasma processing.

The invasion of vapor (moisture, oxygen, etc.) via the exposed parts of the polymer compound layers can be prevented as a result of plasma-processing the exposed parts. Thus, the gas barrier properties of the organic EL display panel can be improved.

According to a second aspect of the present invention, there is provided an improved fabrication method for an organic EL display panel. Firstly, a resin substrate is prepared. Then, at least two inorganic barrier layers and at least one polymer compound layer are deposited on the resin substrate alternately to form a laminate body. Each polymer compound layer is interposed between two adjacent inorganic barrier layers. Exposed parts of the polymer compound layers that are not covered by the inorganic barrier layers are subjected to plasma processing to render the laminate body a gas barrier laminate. An organic electroluminescence element is then formed on the gas barrier laminate. The organic electroluminescence element has a first display electrode, a second display electrode and at least one organic functional layer interposed between the first and second display electrodes. Each organic functional layer is made from an organic compound. The plasma processing may be oxygen plasma processing. The oxygen plasma processing applied to the exposed parts of the polymer compound layer may use a gas mixture of oxygen with any of nitrogen, argon, helium, neon and xenon or a gas mixture of oxygen and halogen gas.

The plasma-processing is applied to the polymer compound layers so that gas barrier properties are imparted to the polymer compound layers. Accordingly, a highly reliable gas barrier laminate can be formed easily, and, therefore, an organic EL display panel with favorable gas barrier properties can be obtained.

According to a third aspect of the present invention, there is provided another fabrication method for an organic EL display. The fabrication method includes providing a resin substrate. The fabrication method also includes depositing at least two inorganic barrier layers and at least one polymer compound layer on the resin substrate alternately to form a laminate body. Each polymer compound layer is interposed between the inorganic barrier layers. The method also includes forming an organic electroluminescence element on the laminate body. The organic electroluminescence element has a first display electrode formed on the first laminate body, an organic functional layer formed on the first display electrode, and a second display electrode formed on the organic functional layer. The fabrication method also includes plasma processing exposed parts of the polymer compound layer, that are not covered by the inorganic barrier layers. This plasma processing is executed when the first display electrode is formed, and imparts gas barrier properties to the laminate body. The first display electrode may be formed by depositing a thin film that is made from an electrically conductive material, placing a resist with a predetermined pattern on the thin film, performing etching with the resist, and removing the resist by taking advantage of the plasma processing applied to the exposed parts of the polymer compound layer.

The polymer compound layers are subjected to plasma processing at the same time as the plasma processing in the first display electrode formation step, and therefore the number of steps to fabricate the organic EL display panel can be reduced.

These and other objects, aspects and advantages of the present invention will become apparent to those skilled in the art from the following detailed description and appended claims when read and understood in conjunction with the accompanying drawings.

DETAILED DESCRIPTION OF THE INVENTION

An embodiment of the organic EL display panel of the present invention will now be described in detail with reference to the attached drawings. The same or similar reference numbers are assigned to the same or similar parts in different drawings. It should be noted that although drive components, wiring and so forth required for the operation of the display panel are included in the organic EL display panel, these parts are omitted from the following description.

Figure 1:
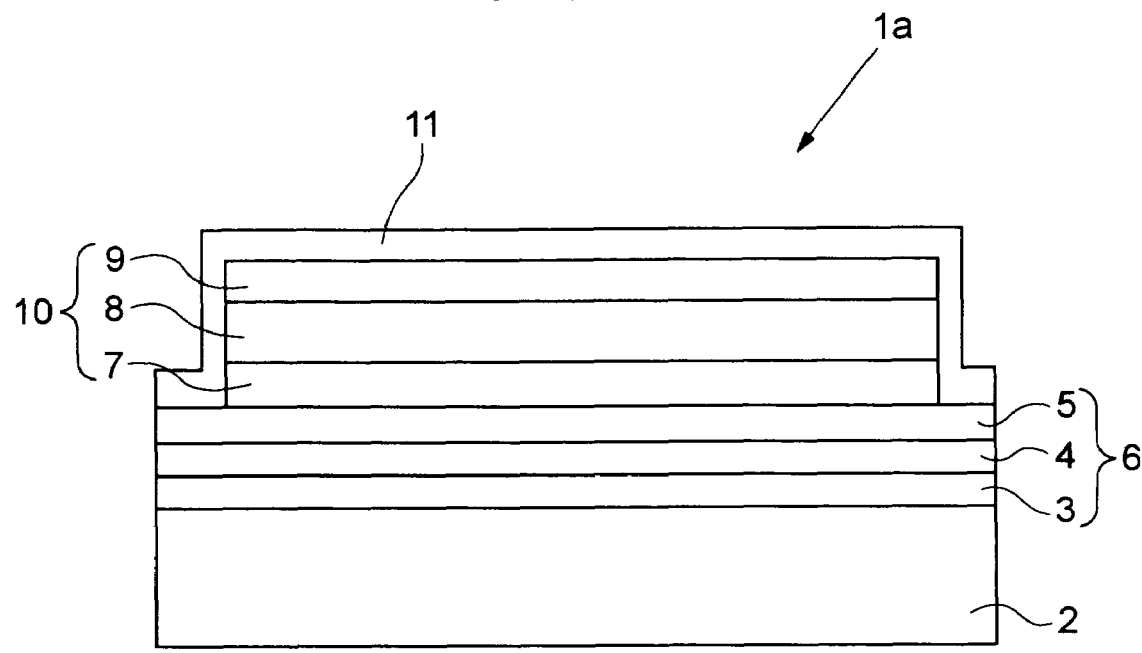
FIG. 1 is a cross-sectional view of the organic EL display panel according to one embodiment of the present invention.

As shown in FIG. 1, an organic EL display panel 1a includes a resin substrate 2. The resin substrate 2 is, for example, made from polyethylene terephthalate, polyethylene-2,6-naphthalate, polycarbonate, polysulphone, polyethersulphone, polyetheretherketone, polyphenoxyether, polyarylate, fluorine resin, polypropylene, polyethylene naphthalate, or polyolefin. The resin substrate 2 may be a flexible film.

A gas barrier layer 6 is formed on the resin substrate 2. The bas barrier layer 6 includes two inorganic barrier layers 3 and 5 and one polymer compound layer 4 that is interposed between the inorganic barrier layers.

Each inorganic barrier layer 3, 5 is made from an inorganic material, such as nitride, oxide or oxynitride, and affords gas barrier properties. For example, silicon nitride, silicon oxide or silicon oxynitride can be used as the material of the inorganic barrier layer. The polymer compound layer 4 is made from an ultraviolet (UV) curable resin, a thermosetting resin, or the like, for example. The polymer compound layer 4 is preferably deposited by means of a wet-type film deposition method such as spin coating. This is because defects such as pinholes do not readily occur in a thin film that is obtained by means of a wet-type film deposition method in comparison with a thin film that is obtained by means of dry-type film deposition.

The exposed parts of the polymer compound layer 4, i.e., those parts of the polymer compound layer 4 that are not covered by the inorganic barrier layers 3 and 5, are subjected to plasma processing. The plasma processing involves surface processing which exposes the polymer compound layer to plasma. This processing improves the quality of the exposed parts of the polymer compound layer to impart the properties of a gas barrier to the exposed parts. In other words, vapor such as moisture is thus unable to invade the organic EL element via the exposed parts of the polymer compound layer (via the end faces of the polymer compound layer).

A first display electrode 7, an organic functional layer 8, and a second display electrode 9 are deposited on the gas barrier layer 6 in that order to form an organic EL element 10. The first display electrode 7 is an anode layer made from a transparent material. The organic functional layer 8 includes at least one light emission layer containing an organic compound that affords an electroluminescence characteristic. The second display electrode 9 is a cathode layer made from a metal material, for example. More than one organic EL elements 10 may be provided on the gas barrier layer 6. These organic EL elements may be arranged uniformly in a matrix to form a matrix-display-type organic EL display panel.

The organic EL element 10 is covered from the rear side by a sealing layer 11 that possesses gas barrier properties. The sealing layer 11 and gas barrier layer 6 serve in combination to seal the organic EL element 10. The sealing layer 11 is made from inorganic materials such as nitrides, oxides and oxynitrides. For example, silicon nitride, silicon oxide, or silicon oxynitride can be used as the material of the sealing layer 11.

The invasion of vapor from the resin substrate to the organic EL element can be prevented by forming the gas barrier layer between the organic EL element and resin substrate. In other words, the route for the vapor to invade the organic EL element via defects such as pinholes in the inorganic barrier layer can be blocked by the interposition of the defect-free polymer compound layer between inorganic barrier layers. In addition, because the exposed parts of the polymer compound layer are plasma-processed, vapor is unable to invade the organic EL element even when these parts of the polymer compound layer are exposed to the outside. Therefore, the route for the vapor to invade the organic EL element from the substrate side can be blocked, and deterioration of the organic EL element does not occur.

The polymer compound layer acts as a cushion (shock-absorbing) layer when stress is applied to the organic EL display panel from the outside. Thus, damage to the inorganic barrier layers can be prevented. As a result, an organic EL display panel that is highly reliable and in which deterioration does not occur can be obtained.

Figure 2:
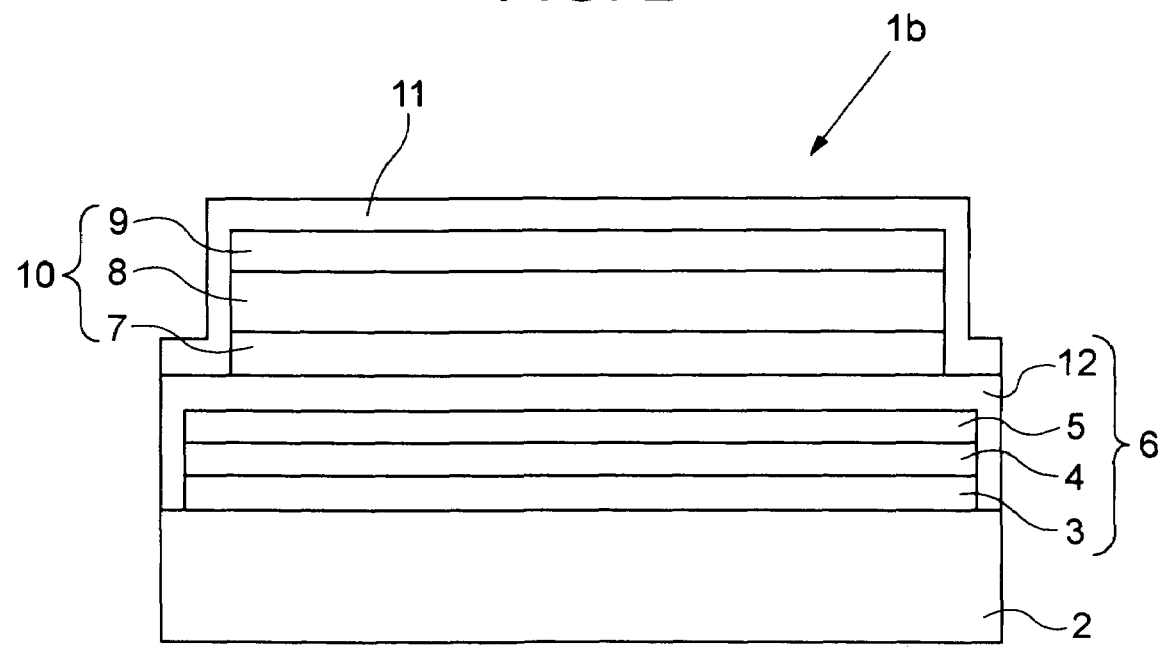
FIG. 2 is a cross-sectional view of a modified example of the organic EL display panel according to the present invention.

Although the gas barrier properties of the gas barrier layer are improved as a result of plasma-processing the exposed parts of the polymer compound layer, the gas barrier properties of the gas barrier layer are more improved by also covering the exposed parts with an inorganic material. For example, the gas barrier layer may include a cover layer affording gas barrier properties that covers at least the exposed parts of the polymer compound layer. For example, as shown in FIG. 2, the organic EL display panel 1*b* includes a modified bas barrier layer 6 on the resin substrate 2. This gas barrier layer 6 includes a laminate body 3, 4, 5 and a cover layer 12. The laminate body includes the polymer compound layer 4 and two inorganic barrier layers 3 and 5 between which the polymer compound layer 4 is interposed. The cover layer 12 is deposited on the laminate body to cover the plasma-processed exposed parts of the polymer compound layer 4. The cover layer 12 has gas barrier properties and is made from inorganic materials such as nitrides, oxides and oxynitride. Silicon nitride, silicon oxide or silicon oxynitride, or the like, can be employed as the cover layer. The remaining constitution is substantially the same as that of the organic EL display panel 1*a* shown in FIG. 1.

As mentioned above, the gas barrier properties of the polymer compound layer improve as a result of also covering the plasma-processed exposed-parts of the polymer compound layer with the cover layer 12. As a result, a highly reliable organic EL display panel can be obtained.

Figure 3:
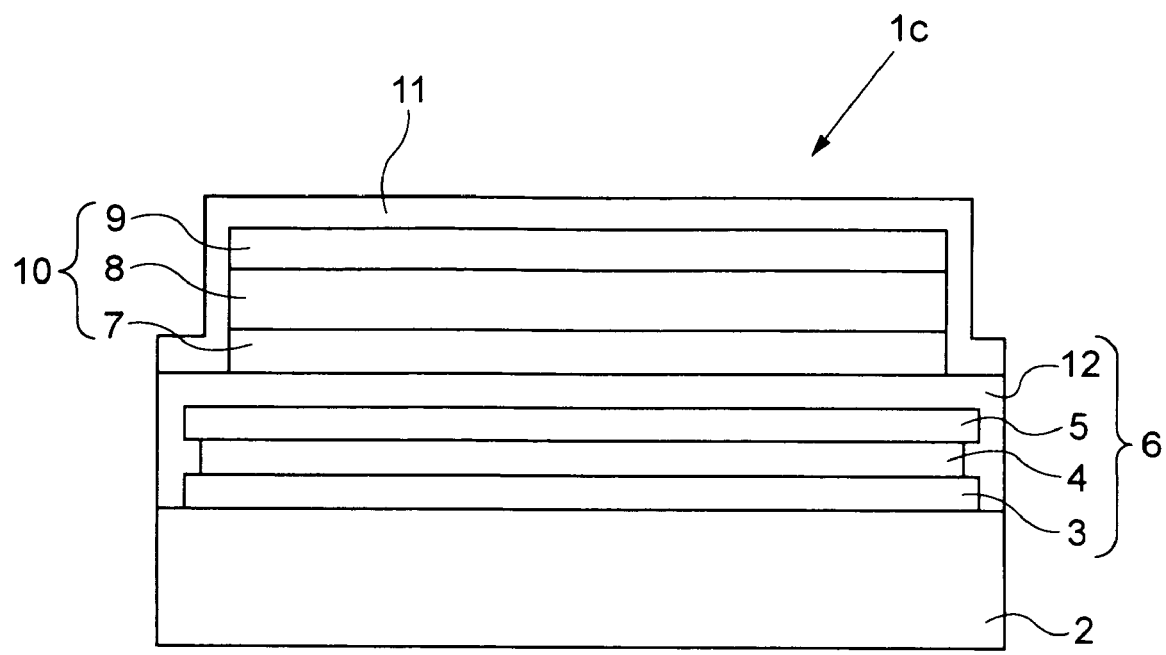
FIG. 3 is a cross-sectional view of another modified example of the organic EL display panel according to the present invention.

Another modification can be made. The ends of the polymer compound layer 4 may lie further inward than the ends of the inorganic barrier layers 3 and 5. For example, as shown in FIG. 3, the polymer compound layer 4 is formed smaller than the inorganic barrier layers 3 and 5 so that the ends of the polymer compound layer 4 may lie on the inside of the periphery of the inorganic barrier layer 3, 5. That is, grooves are formed by the polymer compound layer 4 between the inorganic barrier layers 3 and 5. The cover layer 12 may be deposited to bury these grooves. The remaining constitution is substantially the same as the modified embodiment shown in FIG. 2. Because the sides of the polymer compound layer 4 can be covered by the thick cover layer 12, the invasion of gas via the sides of the polymer compound layer can be prevented, whereby the gas barrier properties of the gas barrier layer can be improved.

Figure 4:
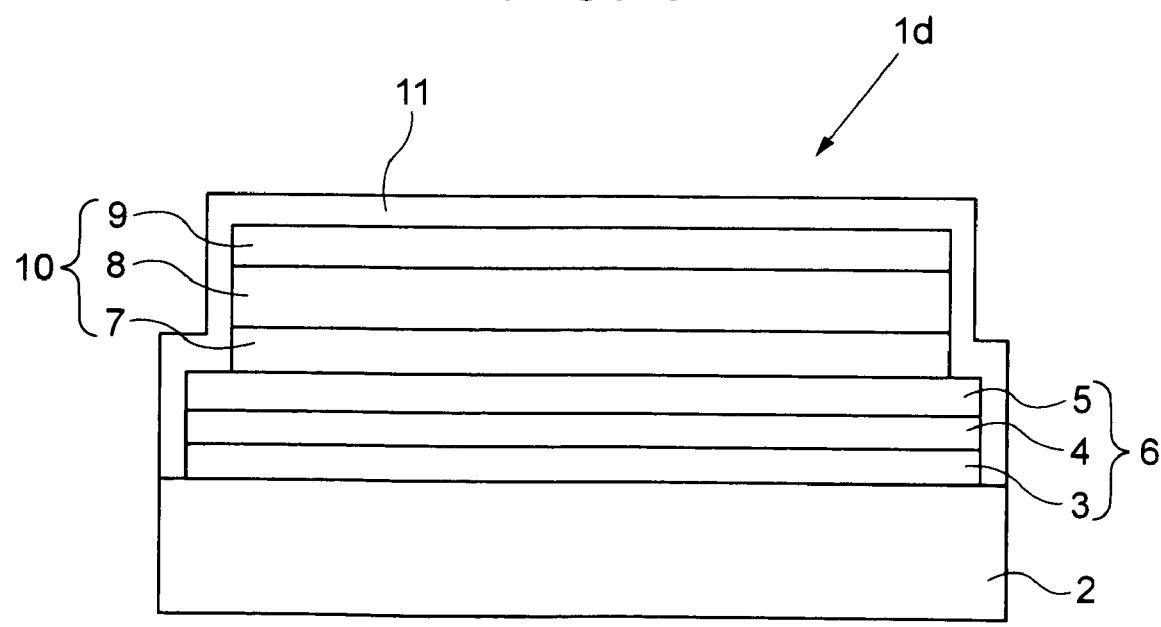
FIG. 4 is a cross-sectional view of still another modified example of the organic EL display panel according to the present invention.

Still another modification will be described. At least the exposed parts of the polymer compound layer may be covered by a sealing layer that is provided to primarily seal the organic EL element. For example, as shown in FIG. 4, the organic EL element 10 is formed on the gas barrier layer 6 that is provided on the resin substrate 2 and the organic EL element 10 may be covered and sealed by the sealing layer 11. The side faces (i.e., the exposed parts) of the polymer compound layer 4 are covered by the sealing layer 11. The sealing layer 11 is made from nitride, oxide or oxynitrides or other inorganic materials and has gas barrier properties. Silicon nitride, silicon oxide or silicon oxynitride can be employed as the material of the sealing layer, for example. As mentioned earlier, the gas barrier properties of the gas barrier layer improve as a result of covering the side faces of the polymer compound layer with the sealing layer.

Figure 5:
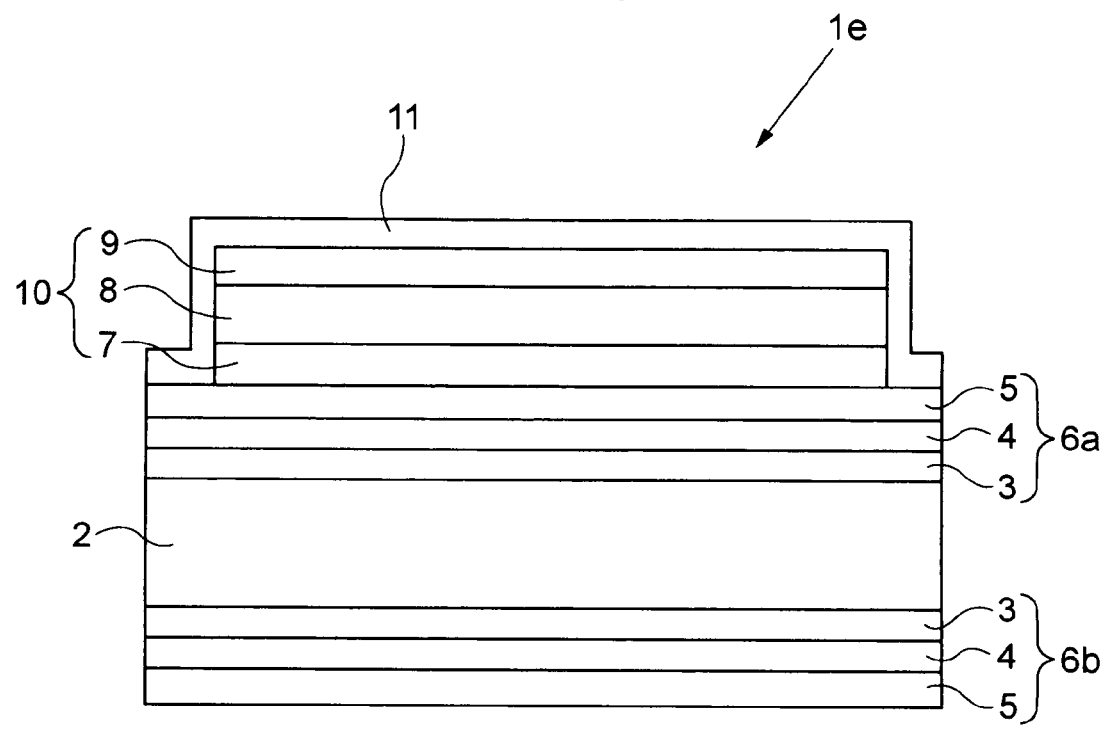
FIG. 5 is a cross-sectional view of yet another modified example of the organic EL display panel according to the present invention.

Yet another modification will be described. A second gas barrier layer may be additionally provided on the other side of the resin substrate. For example, as shown in FIG. 5, the organic EL display panel 1*e* has an additional gas barrier layer 6*b* on the lower surface of the resin substrate 2, as compared with FIG. 1. Thus, the organic EL display panel 1*e* has two gas barrier layers 6*a* and 6*b*. The resin substrate 2 is interposed between the gas barrier layers 6*a* and 6*b*. The exposed parts of the polymer compound layer 4 are plasma-processed in each of the gas barrier layers 6*a* and 6*b*. The remaining constitution is substantially the same as the embodiment example shown in FIG. 1.

Figure 6:
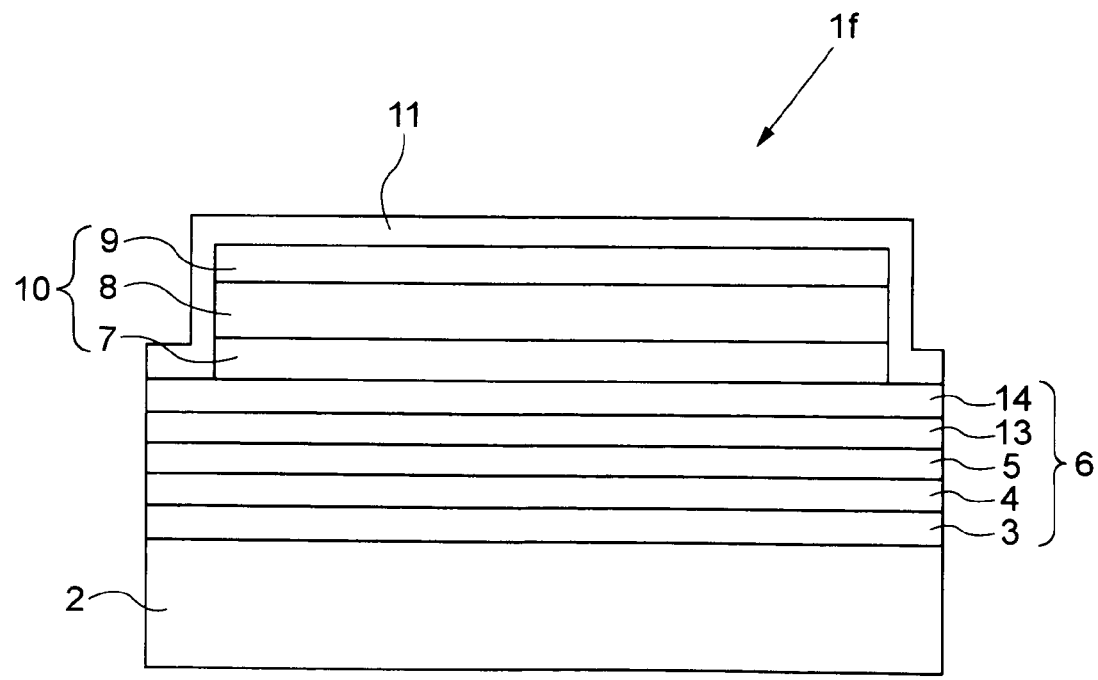
FIG. 6 is a cross-sectional view of another modified example of the organic EL display panel according to the present invention; and FIG. 7A to FIG. 7G is a series of cross-sectional views sequentially showing the fabrication processes of the organic EL display panel according to the present invention.

Although the gas barrier layer 6 includes two inorganic barrier layers 3, 5 and a single polymer compound layer 4 in all the illustrated embodiment and modifications, the present invention is not limited to such a configuration. For instance, a plurality of polymer compound layers may be included in the gas barrier layer. That is, inorganic barrier layers and polymer compound layers may be deposited alternately so that each of the polymer compound layers is interposed between inorganic barrier layers. For example, as shown in FIG. 6, the gas barrier laminate 6 of the organic EL display panel 1*f* includes three inorganic barrier layers 3, 5, and 14 and two polymer compound layers 4 and 13. The first polymer compound layer 4 is sandwiched between the inorganic barrier layers 3 and 5, and the second polymer compound layer 13 is sandwiched between the barrier layers 5 and 14. The remaining constitution is substantially the same as the embodiment example shown in FIG. 1.

Now, the fabrication method of the organic EL display panel will be described with reference to FIGS. 7A-7G.

Figure 7A:
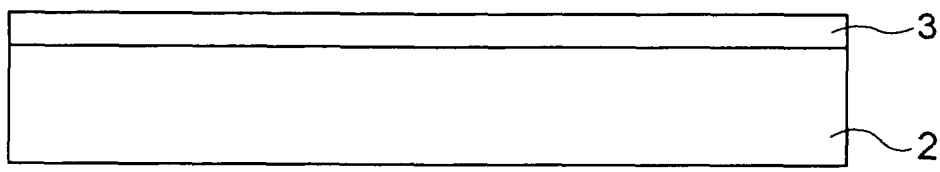
Figure 7B:
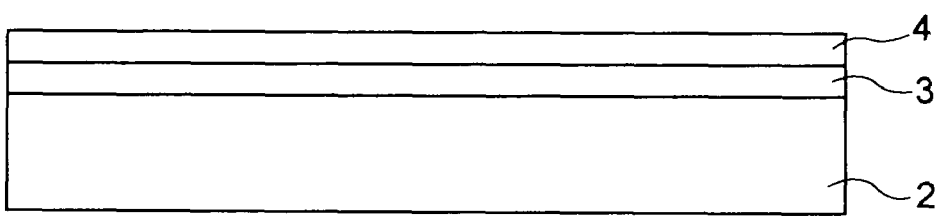

As shown in FIG. 7A, the inorganic barrier layer 3 is deposited on the resin substrate 2 by using a film deposition method such as vacuum deposition, sputtering, or the like. The material of the resin substrate 2 is resin such as a polycarbonate. Then, as shown in FIG. 7B, the polymer compound layer 4 is deposited on the inorganic barrier layer 3 by using a wet-type film deposition method such as spin coating.

Figure 7C:
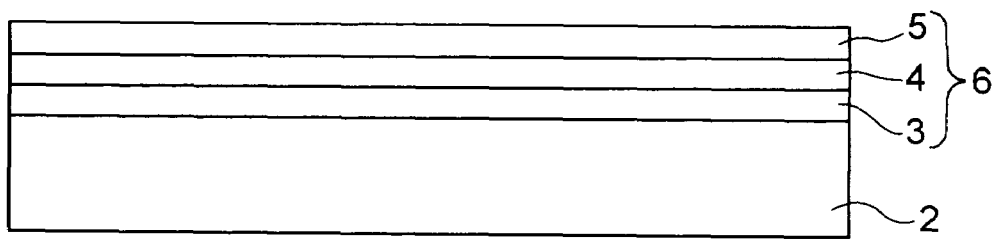

The inorganic barrier layer 5 is deposited on the polymer compound layer 4 by means of a film deposition method such as sputtering, thus forming a laminate body that includes the polymer compound layer 4 interposed between the inorganic barrier layers 3 and 5. The laminate body is subjected to plasma processing to render the laminate body the gas barrier layer 6 (FIG. 7C). The plasma processing is oxygen plasma processing that is executed in a parallel flat plate-type plasma device, for example. Oxygen plasma processing is performed with a gas mixture of oxygen with any of nitrogen, argon, helium, neon and xenon, or a gas mixture of oxygen with a halogen. As a result of performing this processing, the exposed parts of the polymer compound layer 4, that is, the side faces of the polymer compound layer 4 that are not covered by the inorganic barrier layer are plasma-processed. Thus, the gas barrier properties are imparted to the side faces of the polymer compound layer 4.

Figure 7D:
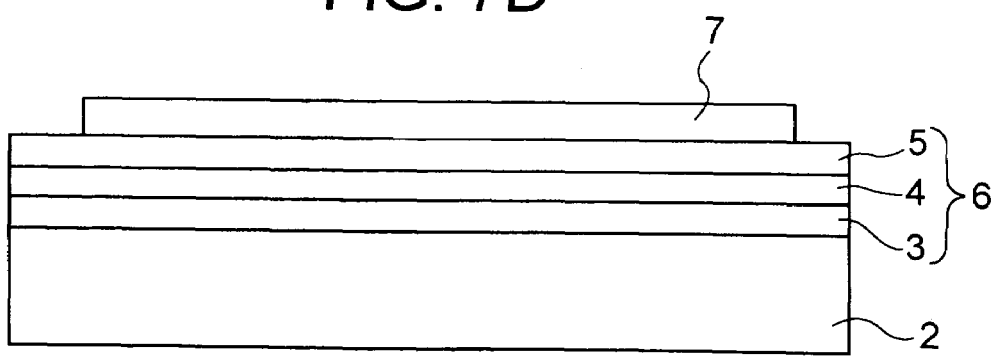

After plasma processing, the first display electrode 7 is formed on the laminate 6 (FIG. 7D). If the material of the first display electrode is an indium tin oxide (ITO), the first display electrode is formed by depositing an ITO film on the entire surface of the barrier layer 5 and then forming a pattern on the ITO film. The pattern-forming step involves placing a photo resist with a predetermined pattern on the ITO film, performing etching with the photo resist serving as a mask, and then removing the photo resist, for example. Removal of the photo resist may be executed by means of plasma ashing with the oxygen plasma, for example.

After the pattern of the first display electrode is formed, plasma processing to improve the quality of the surface of the first display electrode may be performed. For example, when the first display electrode is made from ITO, this plasma processing improves the efficiency of injection of positive holes into the organic functional layer that will be subsequently formed on the first display electrode.

Figure 7E:
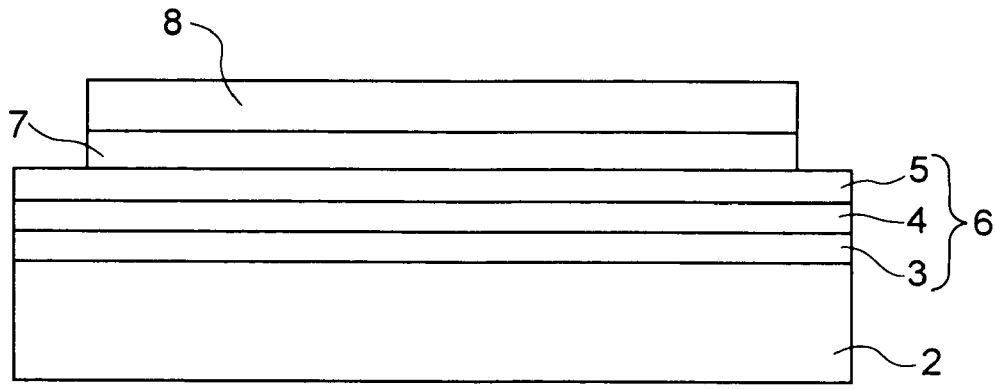

After forming the first display electrode 7, an organic functional layer 8 is formed on the first display electrode 7 as shown in FIG. 7E. The organic functional layer 8 includes a light emission layer containing an organic compound that affords an electroluminescence characteristic. If the material of the organic functional layer is a low molecular organic compound, the organic functional layer 8 is usually prepared by a dry-type film deposition method such as vapor deposition. If the material of the organic functional layer is a high molecular organic compound, a wet-type film deposition method such as spin coating is used.

Figure 7F:
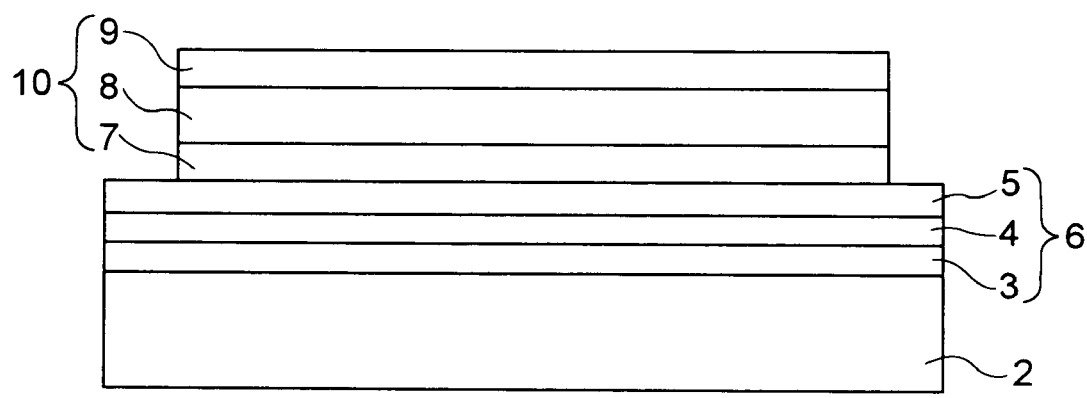

The second display electrode 9 is formed after the organic functional layer 8 is formed (FIG. 7F). If the second display electrode should be made from a metal material such as aluminum (Al), the second display electrode can be formed by using a film deposition method such as vapor deposition. The organic EL element 10 is obtained by providing the second display electrode 9 over the layers 7 and 8.

Figure 7G:
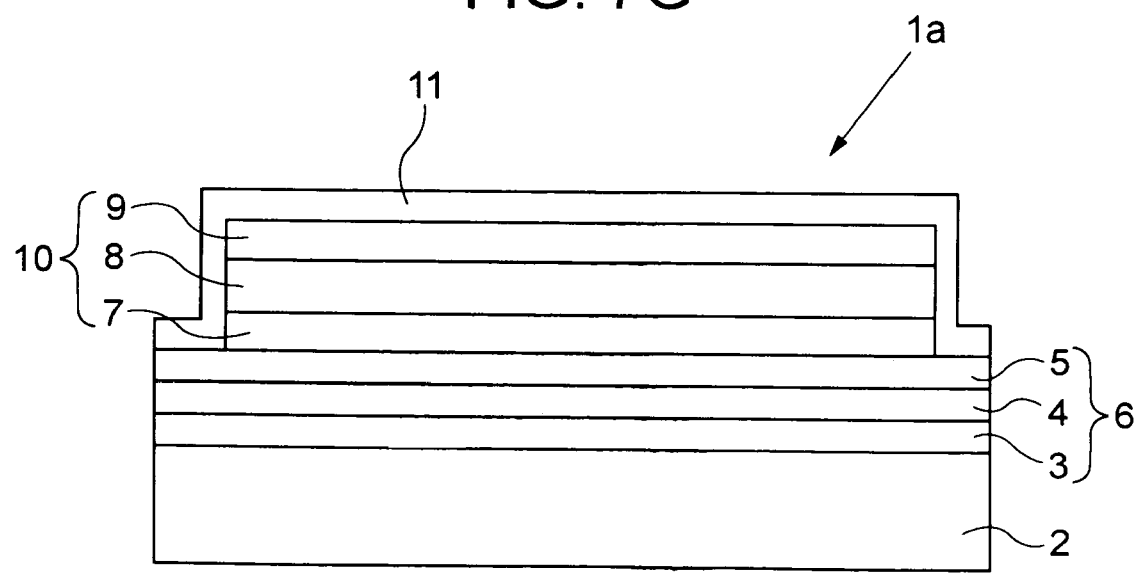

The sealing layer 11, which seals the organic EL element together with the gas barrier layer 6 by covering the organic EL element 10 from the rear face thereof, is formed (FIG. 7G). A film deposition method such as sputtering or plasma CVD can be used to form the sealing layer 11. The organic EL display panel 1a shown in FIG. 1 is obtained by the above steps.

The manufacturing process of the present invention is not limited to the above described process. Various modifications which can be made to the above described manufacturing process will be described below.

First Modification:

A step of forming a cover layer 12 that covers the exposed parts of the polymer compound layer 4 can be included after the plasma processing step. The cover layer 12 is preferably formed by means of an isotropic film deposition method such as plasma CVD or sputtering. The isotropic film deposition method creates a thin film with the isotropic adhesion of deposited molecules. A stepped part can be covered by a cover film of uniform thickness by means of this method.

It should be noted that the deposited molecules flow anisotropically when vapor deposition is used. In general, therefore, the vapor deposition cannot cover a stepped part uniformly with the deposited molecules. However, by causing the substrate to turn, revolve, swing, or the like, with respect to the flow of the vapor deposition molecules, the vapor deposition molecules can be made to adhere isotropically to the stepped part. As a result, an organic EL display panel 1b with enhanced gas barrier properties as shown in FIG. 2 is obtained.

Second Modification:

The plasma processing to the polymer compound layer 4 can be performed excessively so that the polymer compound layer 4 is subjected to etching (ashing) with plasma. That is, the ends of the polymer compound layer are removed with the inorganic barrier layer serving as a mask so that the ends of the polymer compound layer lie further inward than the periphery of the inorganic barrier layer 3, 5. A cover layer 12 may be formed by means of an isotropic film deposition method such as plasma CVD or sputtering so that the end faces of the polymer compound layer 4 are covered with the cover layer. The organic EL display panel 1c as shown in FIG. 3 is thus obtained.

Third modification:

The step of forming the sealing layer 11 can be modified such that this step creates the sealing layer 11 to also cover the exposed parts of the polymer compound layer 4. The sealing layer 11 is preferably formed by means of an isotropic film deposition method such as plasma CVD or sputtering. As a result, an organic EL display panel 1d provided with a gas barrier layer 6 having an improved gas barrier properties as shown in FIG. 4 is obtained.

Fourth Modification:

A step of forming another gas barrier layer 6b on the other face of the resin substrate 2 is included. With this additional step, the organic EL display panel 1e shown in FIG. 5 can be obtained.

Fifth Modification:

A resist may be removed by means of plasma ashing in the first display electrode formation step. Plasma processing to improve the quality of the first display electrode may be executed after forming the first display electrode pattern. In either case, the plasma processing prior to the formation of the first display electrode can be omitted. The plasma processing to the polymer compound layer is carried out by the resist-removing plasma ashing or the first-display-electrode-quality-improving plasma processing.

More specifically, inorganic barrier layers and polymer compound layers are deposited alternately to form a laminate body on the substrate. The polymer compound layers are interposed between the inorganic barrier layers. After that, the first display electrode is formed on the laminate body. Then, in the step of removing the resist used in the formation of the first display electrode pattern by means of plasma ashing, the exposed parts of the polymer compound layer are also subjected to plasma processing to render the laminate body the gas barrier layer. Alternatively, in the step of performing plasma processing to improve the quality of the first display electrode following the formation of the first display electrode pattern, the exposed parts of the polymer compound layer are also subjected to plasma processing to render the laminate body the gas barrier layer.

Sixth Modification:

The step of forming the gas barrier layer 6 may alternately deposit three or more inorganic barrier layers and two or more polymer compound layers. For example, the step of forming the gas barrier layer 6 involves depositing a first inorganic barrier layer 3, a first polymer compound layer 4, a second inorganic barrier layer 5, a second polymer compound layer 13 and a third inorganic barrier layer 14 in that order. As a result, as shown in FIG. 6, an inorganic EL display panel 1f that has the gas barrier laminate 6 having three inorganic barrier layers 3, 5, 14 and two polymer compound layers 4, 13 is obtained.

This application is based on Japanese Patent Application No. 2003-356107 filed on Oct. 16, 2003 and the entire disclosure thereof is incorporated herein by reference.

What is claimed is:

1. An organic electroluminescence display panel comprising:
    an organic electroluminescence element including first and second display electrodes, and at least one organic functional layer made from an organic compound and interposed between the first and second display electrodes;
    a resin substrate that supports the organic electroluminescence element;
    a first gas barrier laminate provided between the resin substrate and the organic electroluminescence element, the first gas barrier laminate including at least two inorganic barrier layers and at least one polymer compound layer that is provided between the inorganic barrier layers, said at least one polymer compound layer being positioned inward of ends of said inorganic barrier layers; and
    an inorganic gas barrier layer formed on exposed parts of said at least one polymer compound layer that are not covered by the inorganic barrier layers.

2. The organic electroluminescence display panel according to claim 1, wherein the inorganic gas barrier layer comprises silicon oxynitride.

3. The organic electroluminescence display panel according to claim 1 further including:
   a sealing layer for covering the organic electroluminescence element such that the sealing layer and the first gas barrier laminate in combination seals the organic electroluminescence element.

4. The organic electroluminescence display panel according to claim 3, wherein the sealing layer comprises at least one member selected from the group consisting of silicon oxynitride and silicon nitride.

5. The organic electroluminescence display panel according to claim 3, wherein said sealing layer is formed on said organic electroluminescence element and said inorganic gas barrier layer.

6. The organic electroluminescence display panel according to claim 1, wherein the inorganic barrier layer comprises at least one member selected from the group consisting of silicon oxynitride and silicon nitride.

7. The organic electroluminescence display panel according to claim 1, wherein the polymer compound layer comprises at least one member selected from the group consisting of a UV curable resin and a thermosetting resin.

8. The organic electroluminescence display panel according to claim 1, further, comprising:
   a second gas barrier laminate provided on another surface of the resin substrate such that the resin substrate is sandwiched by the first and second gas barrier laminates.

9. The organic electroluminescence display panel according to claim 1, wherein said exposed parts of said at least one polymer compound layer comprise plasma-processed exposed parts.

10. The organic electroluminescence display panel according to claim 1, wherein said inorganic gas barrier layer comprises at least one member selected from the group consisting of silicon nitride, silicon oxide, and silicon oxynitride.

11. The organic electroluminescence display panel according to claim 1, wherein said exposed parts of said at least one polymer compound layer comprise end faces of said at least one polymer compound layer.

12. The organic electroluminescence display panel according to claim 11, wherein said at least one polymer compound layer has a length which is less than a length of said at least two inorganic barrier layers, such that said at least one polymer compound layer is positioned inward of ends of said at least two inorganic barrier layers.

13. The organic electroluminescence display panel according to claim 1, wherein said inorganic gas barrier layer is formed on an upper surface of said first gas barrier laminate, and on said ends of said at least two inorganic barrier layers and end faces of said at least one polymer compound layer, and on said substrate.

14. The organic electroluminescence display panel according to claim 1, wherein said organic electroluminescence element is formed on said inorganic gas barrier layer.

* * * * *